(12) United States Patent  (10) Patent No.: US 9,349,903 B2
Hsu  (45) Date of Patent: May 24, 2016

(54) IMAGE SENSING MODULE AND METHOD OF MANUFACTURING THE SAME

(71) Applicant: AZUREWAVE TECHNOLOGIES, INC., New Taipei (TW)

(72) Inventor: Chi-Hsing Hsu, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 14/055,956

(22) Filed: Oct. 17, 2013

(65) Prior Publication Data

US 2015/0048386 A1 Feb. 19, 2015

(30) Foreign Application Priority Data

Aug. 16, 2013 (TW) .............................. 102129460 A

(51) Int. Cl.
*H01L 31/12* (2006.01)
*H01L 31/18* (2006.01)
*H04N 5/225* (2006.01)

(52) U.S. Cl.
CPC ............... *H01L 31/12* (2013.01); *H01L 31/18* (2013.01); *H04N 5/2254* (2013.01); *H04N 5/2257* (2013.01)

(58) Field of Classification Search
CPC . H04N 5/2251; H04N 5/2252; H04N 5/2253; H04N 5/2254
USPC ........................................................ 257/432
See application file for complete search history.

(56) References Cited

U.S. PATENT DOCUMENTS

| | | |
|---|---|---|
| 6,130,448 A * | 10/2000 | Bauer ................. H01L 31/0203 257/215 |
| 7,084,391 B1 | 8/2006 | Chen |
| 2004/0150740 A1* | 8/2004 | Hsin .............................. 348/340 |
| 2005/0184352 A1* | 8/2005 | Jeong et al. .................... 257/432 |
| 2007/0212061 A1 | 9/2007 | Woo |
| 2008/0055438 A1 | 3/2008 | Lee et al. |
| 2009/0040360 A1 | 2/2009 | Taniguchi |
| 2009/0096048 A1* | 4/2009 | Matsumoto .................... 257/432 |
| 2011/0267535 A1* | 11/2011 | Seo ................... H01L 27/14618 348/374 |
| 2012/0141114 A1 | 6/2012 | Gooi et al. |

FOREIGN PATENT DOCUMENTS

| | | |
|---|---|---|
| EP | 1801849 A2 | 6/2007 |
| KR | 10-2011-0120429 A | 11/2011 |
| TW | 200947638 A | 11/2009 |
| WO | WO2006/093377 A1 | 9/2006 |

* cited by examiner

*Primary Examiner* — Christine L Hagan
(74) *Attorney, Agent, or Firm* — Li & Cai Intellectual Property (USA) Office

(57) ABSTRACT

An image sensing module includes an image sensing unit, a light transmitting unit, a substrate unit and lens unit. The image sensing unit includes an image sensing element having an image sensing area on the top side of the image sensing element. The light transmitting unit includes a light transmitting element supported above the image sensing element by a plurality of support members. The substrate unit includes a flexible substrate disposed on the image sensing element and electrically connected to the image sensing element through a plurality of electrical conductors, and the flexible substrate has at least one through opening for receiving the light transmitting element. The lens unit includes an opaque holder disposed on the flexible substrate to cover the light transmitting element and a lens assembly connected to the opaque holder and disposed above the light transmitting element.

10 Claims, 3 Drawing Sheets

IMAGE SENSING MODULE AND METHOD OF MANUFACTURING THE SAME

BACKGROUND OF THE INVENTION

1. Field of the Invention

The instant disclosure relates to an image sensing module and a method of manufacturing the same, and more particularly to an image sensing module for reducing its whole thickness and a method of manufacturing the same.

2. Description of Related Art

The advantage of CMOS (Complementary Metal-Oxide-Semiconductor) is low power consumption and small size, thus the CMOS image-sensing chip package module can integrate into portable electronic device with small size such as mobile phone and notebook. However, the whole thickness of the image-sensing chip package module of the prior art cannot be reduced.

SUMMARY OF THE INVENTION

One aspect of the instant disclosure relates to an image sensing module for reducing its whole thickness and a method of manufacturing the same.

One of the embodiments of the instant disclosure provides an image sensing module, comprising: an image sensing unit, a light transmitting unit, a substrate unit and lens unit. The image sensing unit includes an image sensing element having an image sensing area on the top side of the image sensing element. The light transmitting unit includes a light transmitting element supported above the image sensing element by a plurality of support members, wherein the light transmitting element corresponds to the image sensing area of the image sensing element. The substrate unit includes a flexible substrate disposed on the image sensing element and electrically connected to the image sensing element through a plurality of electrical conductors, wherein the flexible substrate has at least one through opening for receiving the light transmitting element, and the at least one through opening corresponds to the image sensing area of the image sensing element. The lens unit includes an opaque holder disposed on the flexible substrate to cover the light transmitting element and a lens assembly connected to the opaque holder and disposed above the light transmitting element.

Another one of the embodiments of the instant disclosure provides an image sensing module, comprising: an image sensing unit, a light transmitting unit, a substrate unit and lens unit. The image sensing unit includes an image sensing element having an image sensing area on the top side of the image sensing element. The light transmitting unit includes a light transmitting element supported above the image sensing element by a plurality of support members, wherein the light transmitting element corresponds to the image sensing area of the image sensing element. The substrate unit includes a flexible substrate electrically connected to the image sensing element. The lens unit includes an opaque holder disposed on the flexible substrate to cover the light transmitting element and a lens assembly connected to the opaque holder and disposed above the light transmitting element, wherein the opaque holder has at least two abutting support legs directly contacting and downwardly abutting against the top surface of the light transmitting element.

Yet another one of the embodiments of the instant disclosure provides a method of manufacturing an image sensing module, comprising: providing an image sensing element, wherein the image sensing element has an image sensing area on the top side thereof; providing a light transmitting element supported above the image sensing element by a plurality of support members, wherein the light transmitting element corresponds to the image sensing area of the image sensing element; providing a flexible substrate disposed on the image sensing element, wherein the flexible substrate is electrically connected to the image sensing element through a plurality of electrical conductors, the flexible substrate has at least one through opening for receiving the light transmitting element, and the at least one through opening corresponds to the image sensing area of the image sensing element; and then providing a lens unit disposed on the flexible substrate, wherein the lens unit includes an opaque holder disposed on the flexible substrate to cover the light transmitting element and a lens assembly connected to the opaque holder and disposed above the light transmitting element.

More precisely, the support members are connected with each other to form a single surrounding support body disposed on the image sensing element to surround the image sensing area, and the light transmitting element is disposed on the single surrounding support body to cover and enclose the image sensing area, wherein the image sensing element is a CMOS image sensor, the light transmitting element is a transparent glass disposed directly above the image sensing area, and the light transmitting element has an infrared coated layer and an antireflection layer respectively formed on the top surface and the bottom surface of the light transmitting element.

More precisely, the opaque holder has a surrounding support leg and at least two abutting support legs, the surrounding support leg is disposed on the flexible substrate through adhesive glue, and the at least two abutting support legs directly contact and downwardly abut against the top surface of the light transmitting element.

More precisely, the image sensing area of the image sensing element provides a first alignment base level, and the light transmitting element is disposed above the image sensing area of the image sensing element according the first alignment base level, wherein the light transmitting element provides a second alignment base level on the top surface of the light transmitting element, and the opaque holder is disposed on the top surface of the light transmitting element to directly contact the top surface of the light transmitting element according to the second alignment base level, wherein the image sensing element, the light transmitting element and the opaque holder are sequentially stacked on top of one another.

Therefore, because the designs of "the light transmitting unit including a light transmitting element supported above the image sensing element by a plurality of support members and the flexible substrate having at least one through opening for receiving the light transmitting element", the thickness of the light transmitting element can be omitted in the image sensing module of the instant disclosure. Hence, the whole thickness of the image sensing module can be decreased. Furthermore, because the designs of "the light transmitting unit including a light transmitting element supported above the image sensing element by a plurality of support members and the opaque holder having at least two abutting support legs directly contacting and downwardly abutting against the top surface of the light transmitting element", the image sensing element, the light transmitting element and the opaque holder can be sequentially stacked on top of one another according to the design of the first alignment base level provided by the image sensing element and the design of the second alignment base level provided by the light transmitting element. Hence, the assembly tilt of the opaque holder relative to the image sensing element can be decreased.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
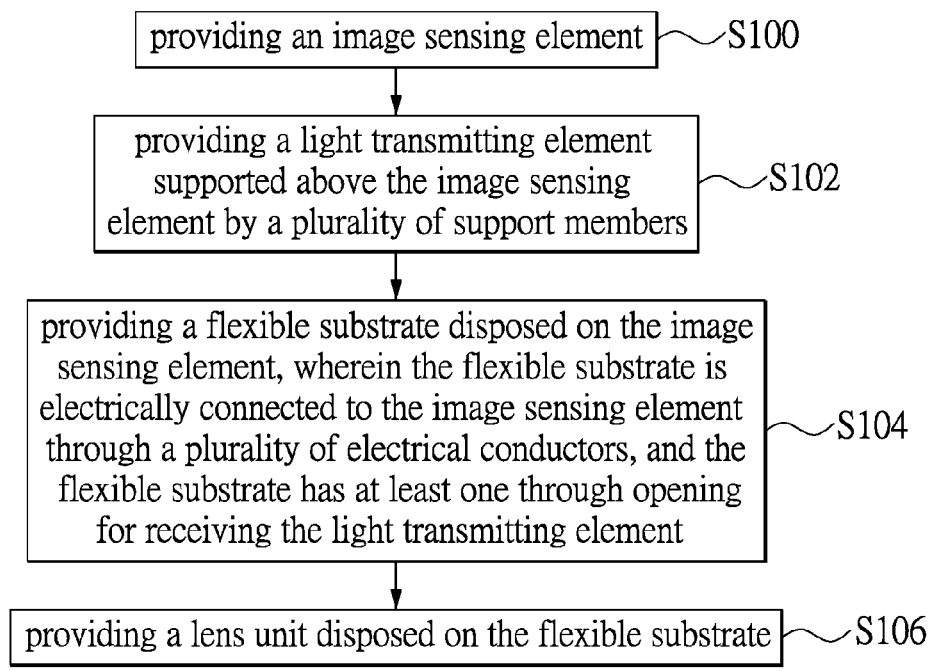
FIG. 1 shows a flowchart of the method of manufacturing an image sensing module for reducing its whole thickness according to the first embodiment of the instant disclosure.
Figure 2:
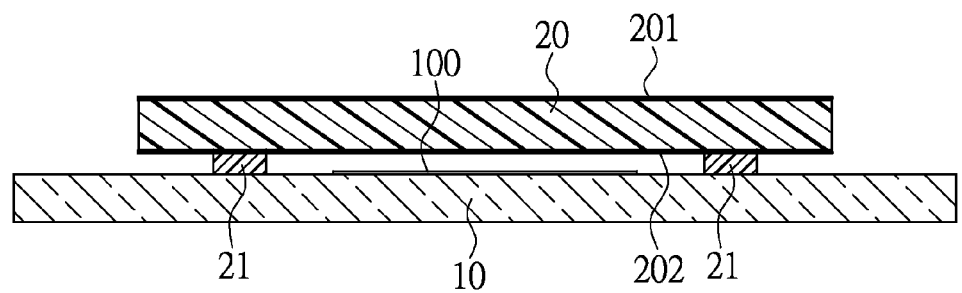
FIG. 2 shows a schematic view of the method of providing a light transmitting element supported above the image sensing element by a plurality of support members according to the first embodiment of the instant disclosure.

Referring to FIG. 1 to FIG. 4, where the first embodiment of the instant disclosure provides a method of manufacturing an image sensing module M for reducing its whole thickness, comprising the following steps:

First, the step S100 is that: referring to FIG. 1 and FIG. 2, providing an image sensing element 10, wherein the image sensing element 10 has an image sensing area 100 on the top side thereof. For example, the image sensing element 10 may be a CMOS (Complementary Metal-Oxide-Semiconductor) image sensor or any image capturing sensor for capturing images. However, the above-mentioned design for the image sensing element 10 of the first embodiment is merely an example and is not meant to limit the instant disclosure.

Next, the step S102 is that: referring to FIG. 1 and FIG. 2, providing a light transmitting element 20 supported above the image sensing element 10 by a plurality of support members 21, wherein the light transmitting element 20 is disposed directly above the image sensing area 100 of the image sensing element 10 for accurately corresponding to the image sensing area 100 of the image sensing element 10. More precisely, the image sensing area 100 of the image sensing element 10 can provide a first alignment base level S1, and the light transmitting element 20 is disposed directly above the image sensing area 100 of the image sensing element 10 according the first alignment base level S1. For example, each support member 21 may be an adhesive material or adhesive glue made of epoxy or silicone, and the light transmitting element 20 can be firmly fixed on the image sensing element 10 by curing the support members 21. The light transmitting element 20 may be a transparent glass disposed directly above the image sensing area 100, and the light transmitting element 20 has an infrared (IR) coated layer 201 and an antireflection layer 202 respectively formed on the top surface and the bottom surface of the light transmitting element 20.

More precisely, the support members 21 can be connected with each other to form a single surrounding support body disposed on the image sensing element 10 to surround the image sensing area 100, and the light transmitting element 20 is disposed on the single surrounding support body to cover and enclose the image sensing area 100. In other words, referring to FIG. 2, the light transmitting element 20 is disposed on the single surrounding support body to form a cap structure for covering and enclosing the image sensing area 100 of the image sensing element 10, thus the cap structure can be used to prevent the image sensing area 100 from being polluted by external air particles. However, the above-mentioned design for the light transmitting element 20 and the support members 21 of the first embodiment is merely an example and is not meant to limit the instant disclosure.

Figure 3:
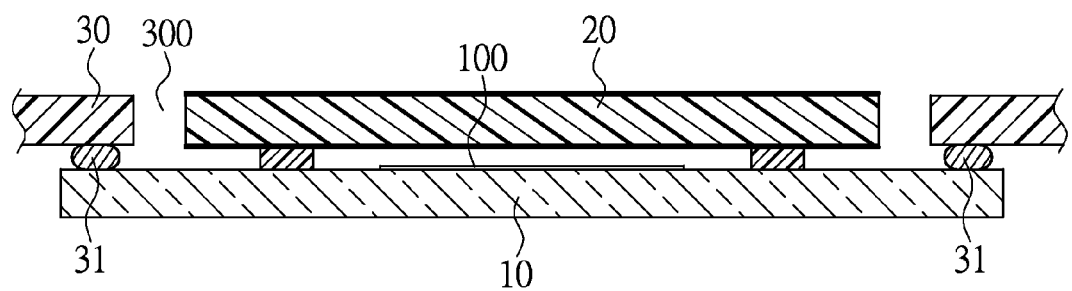
FIG. 3 shows a schematic view of the method of providing a flexible substrate disposed on the image sensing element according to the first embodiment of the instant disclosure.

Then, the step S104 is that: referring to FIG. 1 and FIG. 3, providing a flexible substrate 30 disposed on the image sensing element 10, wherein the flexible substrate 30 is electrically connected to the image sensing element 10 through a plurality of electrical conductors 31, the flexible substrate 30 has at least one through opening 300 for receiving the light transmitting element 20, and the at least one through opening 300 is formed directly above the image sensing area 100 of the image sensing element 10 for accurately corresponding to the image sensing area 100 of the image sensing element 10. For example, the flexible substrate 10 may be any bendable circuit substrate, but it is merely an example and is not meant to limit the instant disclosure.

Figure 4:
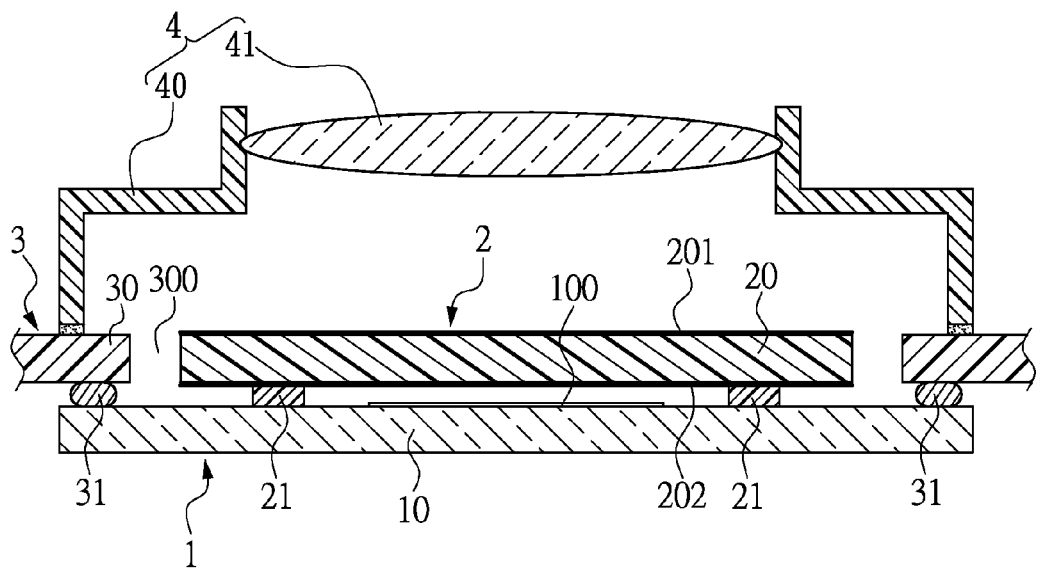
FIG. 4 shows a schematic view of the image sensing module for reducing its whole thickness according to the first embodiment of the instant disclosure.

Afterward, the step S106 is that: referring to FIG. 1 and FIG. 4, providing a lens unit 4 disposed on the flexible substrate 30, wherein the lens unit 4 includes an opaque holder 40 disposed on the flexible substrate 30 to cover the light transmitting element 20 and a lens assembly 41 connected to the opaque holder 40 and disposed above the light transmitting element 20. For example, the lens assembly 41 may be composed of a plurality of lenses, and the lens assembly 41 can be fixedly disposed inside the opaque holder 40 or the lens assembly 41 can be movably disposed inside the opaque holder 40.

In conclusion, referring to FIG. 4 again, the first embodiment of the instant disclosure provides an image sensing module M for reducing its whole thickness, comprising: an image sensing unit 1, a light transmitting unit 2, a substrate unit 3 and lens unit 4. The image sensing unit 1 includes an image sensing element 10 having an image sensing area 100 on the top side of the image sensing element 10. The light transmitting unit 2 includes a light transmitting element 20 supported above the image sensing element 10 by a plurality of support members 21 (i.e., the light transmitting element 20 is supported by the support members 21, thus the light transmitting element 20 is positioned above the image sensing element 10). The light transmitting element 20 corresponds to the image sensing area 100 of the image sensing element 10, and the light transmitting element 20 has an infrared coated layer 201 and an antireflection layer 202 respectively formed on the top surface and the bottom surface of the light transmitting element 20. The substrate unit 3 includes a flexible substrate 30 disposed on the image sensing element 10 through a plurality of electrical conductors 31 (i.e., the flexible substrate 30 is supported by the electrical conductors 31, thus the flexible substrate 30 is positioned above the image sensing element 10), and the flexible substrate 30 is electrically connected to the image sensing element 10 through the electrical conductors 31. The flexible substrate 30 has at least one through opening 300 (such as a penetration hole) for receiving the light transmitting element 20, and the at least one through opening 300 corresponds to the image sensing area 100 of the image sensing element 10. The lens unit 4 includes an opaque holder 40 disposed on the flexible substrate 30 to cover the light transmitting element 20 and a lens assembly 41 connected to the opaque holder 40 and disposed above the light transmitting element 20.

Whereby, the light transmitting element 20 can be disposed on the image sensing element 10 through the support members 21, and the light transmitting element 20 can be received in the at least one through opening 300 of the flexible substrate 30, thus the thickness of the light transmitting element 20 can be omitted in the image sensing module M of the instant disclosure.

More precisely, each electrical conductor 31 can be surrounded by adhesive glue (not shown) for firmly positioning the flexible substrate 30 on the image sensing element 10. In addition, the adhesive glue (not shown) for surrounding each electrical conductor 31 can be extended to connect with the single surrounding support body composed of support members 21, in order to prevent the top surface of the image sensing element 10 from being polluted by external air particles passing through the at least one through opening 300.

Second Embodiment

Figure 5:
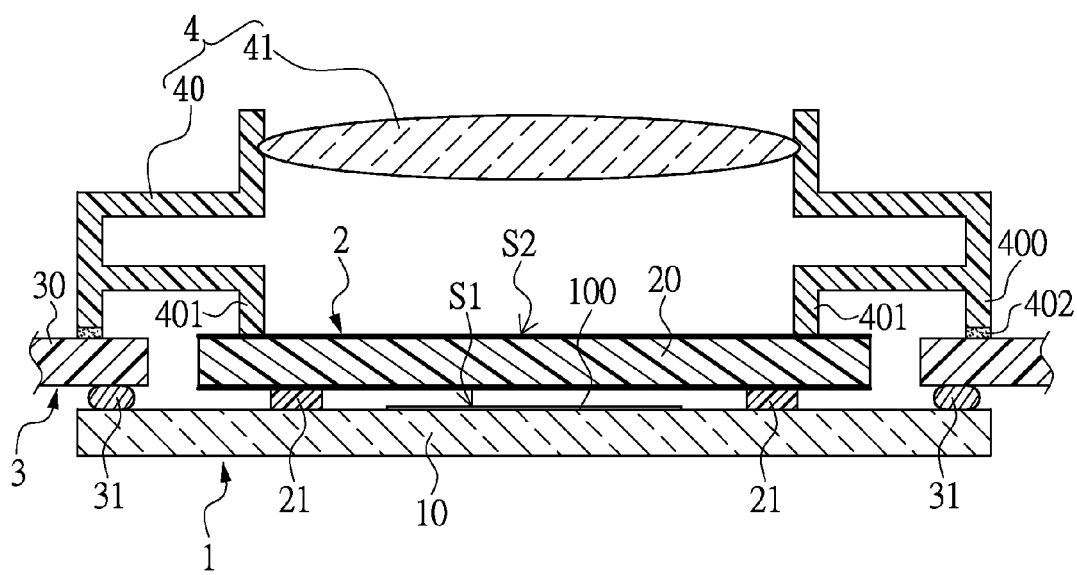
FIG. 5 shows a schematic view of the image sensing module for reducing its whole thickness according to the second embodiment of the instant disclosure.

Referring to FIG. 5, the second embodiment of the instant disclosure provides an image sensing module M for reducing its whole thickness, comprising: an image sensing unit 1, a light transmitting unit 2, a substrate unit 3 and lens unit 4. The image sensing unit 1 includes an image sensing element 10 having an image sensing area 100 on the top side of the image sensing element 10. The light transmitting unit 2 includes a light transmitting element 20 supported above the image sensing element 10 by a plurality of support members 21, and the light transmitting element 20 corresponds to the image sensing area 100 of the image sensing element 10. The substrate unit 3 includes a flexible substrate 30 electrically connected to the image sensing element 10. The lens unit 4 includes an opaque holder 40 disposed on the flexible substrate 30 to cover the light transmitting element 30 and a lens assembly 41 connected to the opaque holder 40 and disposed above the light transmitting element 20. Furthermore, the opaque holder 40 has a surrounding support leg 400 and at least two abutting support legs 401, the surrounding support leg 400 is disposed on the flexible substrate 30 through adhesive glue 402, and the at least two abutting support legs 401 directly contact and downwardly abut against the top surface of the light transmitting element 20.

More precisely, the image sensing area 100 of the image sensing element 10 can provide a first alignment base level S1, and the light transmitting element 20 is disposed directly above the image sensing area 100 of the image sensing element 10 according the first alignment base level S1. In addition, the light transmitting element 20 can provide a second alignment base level S2 on the top surface of the light transmitting element 20, and the opaque holder 40 is disposed on the top surface of the light transmitting element 20 to directly contact the top surface of the light transmitting element 20 according to the second alignment base level S2. Hence, the image sensing element 10, the light transmitting element 20 and the opaque holder 40 can be sequentially stacked on top of one another according to the design of the first alignment base level S1 provided by the image sensing element 10 and the design of the second alignment base level S2 provided by the light transmitting element 20, thus the assembly tilt of the opaque holder 40 relative to the image sensing element 10 can be decreased.

In conclusion, because the designs of "the light transmitting unit 2 including a light transmitting element 20 supported above the image sensing element 10 by a plurality of support members 21 and the flexible substrate 30 having at least one through opening 300 for receiving the light transmitting element 20", the thickness of the light transmitting element 20 can be omitted in the image sensing module M of the instant disclosure. Hence, the whole thickness of the image sensing module M can be decreased. Furthermore, because the designs of "the light transmitting unit 2 including a light transmitting element 20 supported above the image sensing element 10 by a plurality of support members 21 and the opaque holder 40 having at least two abutting support legs 401 directly contacting and downwardly abutting against the top surface of the light transmitting element 20", the image sensing element 10, the light transmitting element 20 and the opaque holder 40 can be sequentially stacked on top of one another according to the design of the first alignment base level S1 provided by the image sensing element 10 and the design of the second alignment base level S2 provided by the light transmitting element 20. Hence, the assembly tilt of the opaque holder 40 relative to the image sensing element 10 can be decreased.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:
1. An image sensing module, comprising:
an image sensing unit including an image sensing element having an image sensing area on the top side of the image sensing element;
a light transmitting unit including a light transmitting element, wherein the light transmitting element corresponds to the image sensing area of the image sensing element;
a substrate unit including a flexible substrate disposed on the image sensing element and electrically connected to the image sensing element through a plurality of electrical conductors, wherein the flexible substrate has a through opening formed directly above the image sensing area for receiving the light transmitting unit, wherein the light transmitting unit is separately surrounded by the flexible substrate, wherein the light transmitting unit is supported above the image sensing element by a single surrounding support body which is disposed between the image sensing element and the light transmitting unit; and
a lens unit including an opaque holder disposed on the flexible substrate and the light transmitting element and a lens assembly connected to the opaque holder and disposed above the light transmitting element, wherein the opaque holder has a surrounding support leg and at least two abutting support legs directly contacting and downwardly abutting against the top surface of the light transmitting element;
wherein the image sensing area of the image sensing element is enclosed by matching the single surrounding support body and the light transmitting element for preventing the image sensing area from being polluted by external air particles;

wherein the light transmitting element is disposed inside the through opening without touching the flexible substrate; and wherein the image sensing element, the single surrounding support body; the light transmitting element, and the at least two abutting support legs of the opaque holder are sequentially stacked on top of one another, and the image sensing element, the electrical conductors, the flexible substrate, and the surrounding support lea of the opaque holder are sequentially stacked on top of one another.

2. The image sensing module of claim 1, wherein the image sensing element is a CMOS image sensor, the light transmitting element is a transparent glass disposed directly above the image sensing area, and the light transmitting element has an infrared filter coated layer and an antireflection layer respectively formed on the top surface and the bottom surface of the light transmitting element.

3. The image sensing module of claim 1, wherein the surrounding support leg is disposed on the flexible substrate through adhesive glue.

4. The image sensing module of claim 1, wherein the image sensing area of the image sensing element provides a first alignment base level, and the light transmitting element is disposed above the image sensing area of the image sensing element according to the first alignment base level, wherein the light transmitting element provides a second alignment base level on the top surface of the light transmitting element, and the opaque holder is disposed on the top surface of the light transmitting element to directly contact the top surface of the light transmitting element according to the second alignment base level.

5. An image sensing module, comprising:
  an image sensing unit including an image sensing element having an image sensing area on the top side of the image sensing element;
  a light transmitting unit including a light transmitting element, wherein the light transmitting element corresponds to the image sensing area of the image sensing element;
  a substrate unit including a flexible substrate electrically connected to the image sensing element, wherein the flexible substrate has a through opening formed directly above the image sensing area for receiving the light transmitting unit, wherein the light transmitting unit is separately surrounded by the flexible substrate, wherein the light transmitting unit is supported above the image sensing element by a single surrounding support body which is disposed between the image sensing element and the light transmitting unit; and
  a lens unit including an opaque holder disposed on the flexible substrate and the light transmitting element and a lens assembly connected to the opaque holder and disposed above the light transmitting element, wherein the opaque holder has a surrounding support leg disposed on the flexible substrate through adhesive glue and at least two abutting support legs directly contacting and downwardly abutting against the top surface of the light transmitting element;
  wherein the image sensing area of the image sensing element is enclosed by matching the single surrounding support body and the light transmitting element for preventing the image sensing area from being polluted by external air particles;
  wherein the light transmitting element is disposed inside the through opening without touching the flexible substrate;
  wherein the image sensing element, the single surrounding support body, the light transmitting element, and the at least two abutting support legs of the opaque holder are sequentially stacked on top of one another, and the image sensing element, the electrical conductors, the flexible substrate, and the surrounding support leg of the opaque holder are sequentially stacked on top of one another.

6. The image sensing module of claim 5, wherein the flexible substrate is disposed on the image sensing element and electrically connected to the image sensing element through a plurality of electrical conductors, the at least one through opening corresponds to the image sensing area of the image sensing element.

7. The image sensing module of claim 5, wherein the image sensing area of the image sensing element provides a first alignment base level, and the light transmitting element is disposed above the image sensing area of the image sensing element according to the first alignment base level, wherein the light transmitting element provides a second alignment base level on the top surface of the light transmitting element, and the opaque holder is disposed on the top surface of the light transmitting element to directly contact the top surface of the light transmitting element according to the second alignment base level.

8. A method of manufacturing an image sensing module, comprising:
  providing an image sensing element, wherein the image sensing element has an image sensing area on the top side thereof;
  providing a light transmitting element, wherein the light transmitting element corresponds to the image sensing area of the image sensing element;
  providing a flexible substrate disposed on the image sensing element, wherein the flexible substrate is electrically connected to the image sensing element through a plurality of electrical conductors, the flexible substrate has a through opening formed directly above the image sensing area for receiving the light transmitting unit, wherein the light transmitting unit is separately surrounded by the flexible substrate, wherein the light transmitting unit is supported above the image sensing element by a single surrounding support body which is disposed between the image sensing element and the light transmitting unit; and
  providing a lens unit disposed on the flexible substrate, wherein the lens unit includes an opaque holder disposed on the flexible substrate and the light transmitting element and a lens assembly connected to the opaque holder and disposed above the light transmitting element, and the opaque holder has a surrounding support leg and at least two abutting support legs directly contacting and downwardly abutting against the top surface of the light transmitting element;
  wherein the image sensing area of the image sensing element is enclosed by matching the single surrounding support body and the light transmitting element for preventing the image sensing area from being polluted by external air particles;
  wherein the light transmitting element is disposed inside the through opening without touching the flexible substrate; and
  wherein the image sensing element, the single surrounding support body, the light transmitting element, and the at least two abutting support legs of the opaque holder are sequentially stacked on top of one another, and the image sensing element, the electrical conductors, the flexible substrate, and the surrounding support leg of the opaque holder are sequentially stacked on top of one another.

9. The method of claim 8, wherein the surrounding support leg is disposed on the flexible substrate through adhesive glue.

10. The method of claim 8, wherein the image sensing area of the image sensing element provides a first alignment base level, and the light transmitting element is disposed above the image sensing area of the image sensing element according to the first alignment base level, wherein the light transmitting element provides a second alignment base level on the top surface of the light transmitting element, and the opaque holder is disposed on the top surface of the light transmitting element to directly contact the top surface of the light transmitting element according to the second alignment base level.

* * * * *